US006784017B2

(12) United States Patent
Yang et al.

(10) Patent No.: US 6,784,017 B2
(45) Date of Patent: Aug. 31, 2004

(54) METHOD OF CREATING A HIGH PERFORMANCE ORGANIC SEMICONDUCTOR DEVICE

(75) Inventors: Yang Yang, Los Angeles, CA (US); Liping Ma, Los Angeles, CA (US); Michael L. Beigel, Encinitas, CA (US)

(73) Assignee: Precision Dynamics Corporation, San Fernando, CA (US)

(*) Notice: Subject to any disclaimer, the term of this patent is extended or adjusted under 35 U.S.C. 154(b) by 0 days.

(21) Appl. No.: 10/218,141

(22) Filed: Aug. 12, 2002

(65) Prior Publication Data

US 2004/0033641 A1 Feb. 19, 2004

(51) Int. Cl.[7] .................. H01L 51/40; H01L 21/00; H01L 21/338; H01L 21/28; H01L 21/44

(52) U.S. Cl. .................. 438/99; 438/82; 438/149; 438/167; 438/169; 438/378; 438/570; 438/571; 438/597; 438/623; 438/660; 438/661; 438/662; 438/663; 438/666; 438/687; 438/388; 438/780; 438/781; 438/795

(58) Field of Search .................. 438/82, 99, 149, 438/167, 169, 378, 570–571, 597, 623, 660–663, 666, 687–688, 780–781; 738/795

(56) References Cited

U.S. PATENT DOCUMENTS

| | | | | |
|---|---|---|---|---|
| 4,557,978 A | * | 12/1985 | Mason | .................. 428/457 |
| 4,962,088 A | | 10/1990 | Micheli et al. | |
| 5,213,983 A | | 5/1993 | Gustafsson et al. | |
| 5,250,388 A | | 10/1993 | Scoch, Jr. et al. | |
| 5,399,502 A | * | 3/1995 | Friend et al. | .................. 438/22 |
| 5,574,291 A | | 11/1996 | Dodabalapur et al. | |
| 5,861,219 A | * | 1/1999 | Thompson et al. | .................. 428/690 |
| 5,969,376 A | | 10/1999 | Bao | |
| 5,986,206 A | * | 11/1999 | Kambe et al. | .................. 136/263 |
| 6,177,859 B1 | | 1/2001 | Tuttle et al. | |
| 6,204,515 B1 | | 3/2001 | Bernius et al. | |
| 6,207,034 B1 | | 3/2001 | Madden et al. | |
| 6,207,472 B1 | | 3/2001 | Callegari et al. | |
| 6,241,921 B1 | | 6/2001 | Jacobson et al. | |
| 6,246,102 B1 | | 6/2001 | Sauerbrey et al. | |
| 6,249,076 B1 | | 6/2001 | Madden et al. | |
| 6,265,243 B1 | | 7/2001 | Katz et al. | |
| 6,278,127 B1 | | 8/2001 | Dodabalapur et al. | |
| 6,291,126 B2 | | 9/2001 | Wolk et al. | |
| 6,307,605 B1 | | 10/2001 | Bailey | |
| 6,320,200 B1 | | 11/2001 | Reed et al. | |
| 6,329,226 B1 | | 12/2001 | Jones et al. | |

(List continued on next page.)

OTHER PUBLICATIONS

EPO Publication No. EP 1 005 013 B1 entitled "Display Comprising Organic Smart Pixels", Jul. 25, 2001.

(List continued on next page.)

Primary Examiner—John F. Niebling
Assistant Examiner—Stanetta Isaac
(74) Attorney, Agent, or Firm—Kelly, Lowry & Kelley, LLP

(57) ABSTRACT

A high temperature thermal annealing process creates a low resistance contact between a metal material and an organic material of an organic semiconductor device, which improves the efficiency of carrier injection. The process forms ohmic contacts and Schottky contacts. Additionally, the process may cause metal ions or atoms to migrate or diffuse into the organic material, cause the organic material to crystallize, or both. The resulting organic semiconductor device has enhanced operating characteristics such as faster speeds of operation. Instead of using heat, the process may use other forms of energy, such as voltage, current, electromagnetic radiation energy for localized heating, infrared energy and ultraviolet energy. An example enhanced organic diode comprising aluminum, carbon $C_{60}$, and copper is described, as well as example insulated gate field effect transistors.

59 Claims, 6 Drawing Sheets

U.S. PATENT DOCUMENTS

| | | | |
|---|---|---|---|
| 6,335,539 B1 | | 1/2002 | Dimitrakopoulos et al. |
| 6,340,789 B1 | * | 1/2002 | Petritsch et al. ............. 136/263 |
| 6,433,359 B1 | * | 8/2002 | Kelley et al. .................. 257/40 |
| 6,445,006 B1 | * | 9/2002 | Brandes et al. ................ 257/76 |
| 6,472,705 B1 | * | 10/2002 | Bethune et al. ............. 257/314 |
| 6,515,298 B2 | * | 2/2003 | Forrest et al. ................. 257/40 |
| 6,534,329 B2 | * | 3/2003 | Heeger et al. ................. 438/22 |
| 6,555,411 B1 | | 4/2003 | Bao et al. |
| 6,580,027 B2 | * | 6/2003 | Forrest et al. ............... 136/263 |
| 6,617,609 B2 | * | 9/2003 | Kelley et al. .................. 257/40 |
| 2001/0029103 A1 | | 10/2001 | Katz et al. |
| 2001/0036561 A1 | | 11/2001 | Wolk et al. |
| 2002/0012445 A1 | | 1/2002 | Perry |
| 2002/0015024 A1 | | 2/2002 | Westerman et al. |
| 2002/0015907 A1 | | 2/2002 | Wolk et al. |
| 2002/0019296 A1 | | 2/2002 | Freeman et al. |
| 2002/0086554 A1 | * | 7/2002 | O'Donnell et al. ......... 438/780 |

OTHER PUBLICATIONS

PCT Publication No. WO 01/07993 A1 entitled, "Wearable Device", Feb. 1, 2001.

PCT Publication No. WO 01/17029 A1 entitled, "Transistor for an Electronically Driven Display", Mar. 8, 2001.

PCT Publication No. WO 01/20402 A1 entitled, "Fabrication of Finely Featured Devices by Liquid Embossing", Mar. 22, 2001.

PCT Publication No. WO 01/39111 A1 entitled, "Chip Card", May 31, 2001.

PCT Publication No. WO 01/46987 A2 entitled, "InkjetFabricated Integrated Circuits", Jun. 28, 2001.

PCT Publication No. WO 01/95384 A1 entitled, "A Method of Electronic Component Fabrication and an Electronic Component", Dec. 13, 2001.

PCT Publication No. WO 02/09190 A1 entitled, "Transistor Gate Insulator Layer Incorporating Superfine Ceramic Particles", Jan. 31, 2002.

EE Times article by R. Colin Johnson entitled "Nanotubes Self–Assemble into Circuit Elements", Mar. 26, 2002, http://www.eet.com.story/OEG20020326S0038, 7 pgs.

The Clock Magazine Mar./Apr. 2002 article entitled "The OLED Bazaar", Apr. 16, 2002, http://www/theclockmag.com.april/oledadobeedit.htm020326S0038, 21 pgs.

* cited by examiner

METHOD OF CREATING A HIGH PERFORMANCE ORGANIC SEMICONDUCTOR DEVICE

BACKGROUND OF THE INVENTION

1. Field of the Invention

The field of the invention relates generally to organic semiconductors and more particularly, to high performance organic semiconductor devices and a method for creating high performance organic semiconductor devices.

2. Background

Organic and polymer materials are currently being investigated for use as the active layer in various electronic devices. Organic materials provide advantages over silicon materials, including lower costs, compatibility with flexible substrates, and possibility of being printed or spin-coated to form electronic devices. Certain organic electronic devices have been already conceived and fabricated. For example, organic diodes, organic light-emitting diodes (OLEDs) and thin film transistors with an organic active layer are known. See, e.g., the devices described in: (1) Jie Liu, Tzung-Fang Guo and Yang Yang, "Effects of thermal annealing on the performance of polymer light emitting diodes", J. Appl. Phys., 91, 1595–1600 (2002); (2) Jie Liu, Yijian Shi, and Yang Yang, "Solvation-induced morphology effects on the performance of polymer-based photovoltaic devices", Adv. Functional Materials, 11, pp 420–424, (2001); (3) Jie Liu, Yijian Shi, and Yang Yang, "Improving the performance of polymer light-emitting diodes using polymer solid-solutions", J. Appl. Phys. 89, 3668, (2001); (4) J. Liu, Y. Shi, and Y. Yang; "Solvation induced morphological effects on the formation of polymer/metal contacts"; J. Appl. Phys. 89, 3668 (2000); (5) Yang Yang, Shun-Chi Chang, Jayesh Bharathan, and Jie Liu, "Organic/polymeric electroluminescent devices processed by hybrid ink-jet printing", Journal of Materials Science: Materials in Electronics 11(2000) 89–96; (6) J. Liu, Y. Shi, and Y. Yang, Device performance and polymer morphology in polymer light-emitting diodes: the control of electric properties; J. Appl. Phys., 88, 605, (2000); (7) Y. Shi, J. Liu, and Y. Yang, Device performance and polymer morphology in polymer light-emitting diodes: the control of thin film morphology and device quantum efficiency; J. Appl. Phys., 87, 4254 (2000); (8) S. C. Chang, J. Bharathan, J. Liu, and Y. Yang, Multicolor organic light-emitting diodes processed by ink-jet printing, Adv. Mat. 11, 734, (1999); and (9) S. C. Chang, J. Bharathan, and Y. Yang; "Dual-color polymer LEDs processed by hybrid inkjet printing technology", Appl. Phys. Lett., 73, 2561, (1998). The above references are incorporated herein by reference in their entireties.

As used herein, "organic semiconductor" refers to a material that contains a substantial amount of carbon in combination with other elements, or that comprises an allotrope of elemental carbon, excluding diamond, and exhibits a charge carrier mobility of at least $10^{-3}$ cm$^2$/V-s at room temperature (20° C.). However, despite considerable research and development effort in organic semiconductor devices, these organic devices have not been widely commercialized yet, due in large part to their poor device characteristics relative to their silicon counterparts. While some organic light-emitting devices seem to perform similarly to inorganic light-emitting devices, the performance of other organic electronic devices, such as diodes, is poor as compared to their silicon counterparts. For example, organic diodes have a much lower frequency response and can handle a smaller current density than diodes made of silicon. These performance deficiencies are mainly due to the low carrier mobility and other characteristics of organic materials. Organic transistors, due to their low carrier mobility, can only handle low current densities and are not suitable for use as switches in high current density applications such as organic light-emitting diodes for displays. Nor are present day organic devices able to operate at high frequencies, such as 13 megahertz (MHz), 900 MHz and 2.4 gigahertz (GHz), where many of today's silicon-based applications exist. For example, in radio frequency identification bands, patch antennas may be used at about 900 MHz; at about 13 MHz, coil antennas may be used. In order to build electronic circuits from organic semiconductor components, the problem of poor performance of organic semiconductor devices must be overcome.

Conjugated organic materials are organic materials where the electrons are crowded together near double or triple bonds. Conjugated organic materials are often treated as semiconductors with very low doping concentrations. Therefore, a rigid energy band structure at the interface between the metal and organic layers is often adopted. Due to the lack of surface states, the nature of the metal-organic interface, including barrier height and charge injection efficiency, is quite sensitive to the work function of the contact metal. These phenomena differ significantly from those of inorganic semiconductor where the mid-gap surface energy states, caused by the dangling bonds, pin the surface Fermi level. Hence, the silicon-metal interface weakly reflects the difference of the metal work functions. But, for organic diodes, the current rectification typically arises out of the difference in the work functions of the anode and cathode. For efficient charge injection and high rectification ratio, organic diodes require the use of high work function metals, such as gold or indium-tin oxide, as the anode, and low work function metals, such as calcium, as the cathode. However, despite the rapid progress in the field of organic light-emitting diodes and organic electroluminescence displays in the past ten years, the performance of general organic semiconductor devices such as diodes and transistors is still poor compared to inorganic semiconductor devices. As mentioned above, this is mainly due to the low carrier mobility, poor contact or junction between the metal and the organic material, and other characteristics of organic materials, which limit the applications of organic electronic devices to other areas, such as high speed wireless identification tags with predominantly or all organic components.

Further, in order to create a high performance organic transistor, high quality ohmic contacts between the electrodes and the organic material are generally required for efficient charge injection. However, current organic electronic devices lack a good ohmic contact and the prior art does not have a controllable process for creating an ohmic contact. In fact, one of the technological bottlenecks for creating high performance organic transistors will be the formation of good source and drain ohmic contacts to the organic layer. For certain types of devices, it is important to create a high quality rectified junction, such as a Schottky barrier junction or a p-n junction.

Therefore, there is a need for high performance organic semiconductor devices and a method for making them. Such high performance devices should have improved operating characteristics including, for example, better contacts and junctions between the metal and organic materials, the ability to operate at higher frequencies than presently possible, and/or higher current capacities.

SUMMARY OF THE INVENTION

One embodiment of the novel process creates a low resistance contact between a metal material and an organic material of an organic semiconductor device, which improves the efficiency of carrier injection, enhances operating characteristics of the organic semiconductor device such as operating speeds and current carrying capacity, and/or may create an ohmic contact and/or a Schottky barrier junction. Additionally, the process may cause metal ions or atoms to migrate or diffuse into the organic material, cause the organic material to crystallize, or both. The novel process may subject the organic semiconductor device to thermal or other forms of energy, such as voltage, current, electromagnetic radiation energy (e.g., laser energy) for localized heating, infrared energy and/or ultraviolet energy. An example result of the novel process is an enhanced organic diode comprising aluminum, carbon $C_{60}$, and copper that can operate at high frequencies.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts throughout the different views. However, like parts do not always have like reference numerals. Moreover, all illustrations are intended to convey concepts, where relative sizes, shapes and other detailed attributes may be illustrated schematically rather than literally or precisely.

DETAILED DESCRIPTION OF THE PREFERRED EMBODIMENTS

A novel process for fabricating organic and polymer semiconductors results in improved performance characteristics. Organic materials are those materials that are, contain, comprise, or relate to carbon. The term "polymer" refers to a subset of organic materials, such as natural or synthetic compounds having a repeated structural units. For the sake of convenience and simplicity, this disclosure uses the term "organic" to include polymers.

Figure 1:
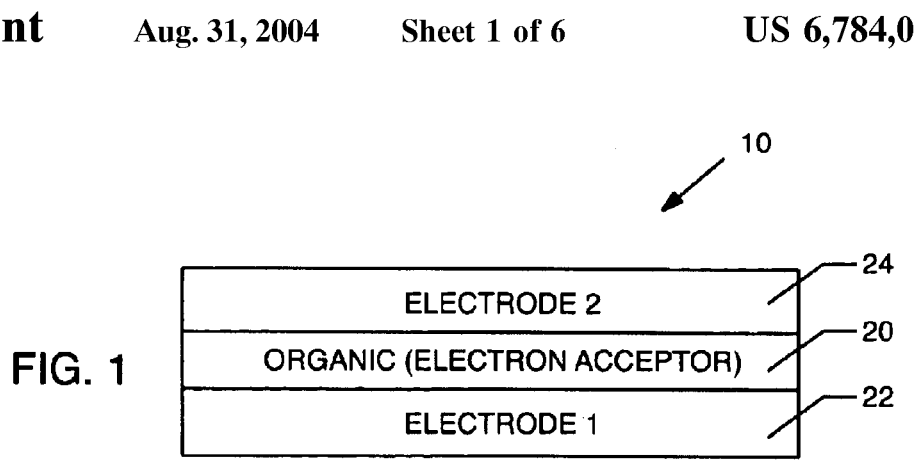
FIG. 1 is a high level representation of a side view of an example embodiment of a high performance organic diode.

FIG. 1 illustrates an example embodiment of the device structure of a high performance organic semiconductor device 10. The organic semiconductor device 10 comprises an organic layer or organic multi-layers 20, a first electrode 22 and a second electrode 24. For the sake of convenience, reference 20 refers to either an organic layer or organic multi-layers, and the term "organic layer" shall include both an organic layer and organic multi-layers. Although not illustrated in FIG. 1, the organic semiconductor device 10 may be supported on a substrate, if desired. In the case where the organic semiconductor device 10 is a diode or charge-rectifying device, the first electrode 22 may be an anode and the second electrode 24 may be a cathode, for example. Alternatively, the first electrode 22 may be a cathode and the second electrode 24 may be an anode. The electrodes 22 and 24 can be a pure metal, metal alloy, multi-layer metal, metal compounds, or some other conductive material including conductive non-metals. While FIG. 1 depicts the first and second electrodes 22, 24 as having the same dimensions as each other and as the organic layer 20, this Figure is merely schematic in nature. Certainly, the dimensions of the organic layer 20, first electrode 22 and second electrode 24 can be changed relative to one another. For example, the first and second electrodes 22, 24 can be thinner and smaller than the organic layer 20, depending on the device characteristics that are desired.

Figure 2:
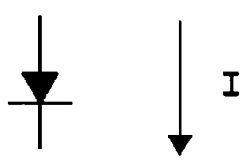
FIG. 2 is a representation of the electronic symbol and current flow for the high performance organic diode of FIG. 1.

If the organic semiconductor device 10 of FIG. 1 is configured to be a diode, FIG. 2 illustrates the electronics symbol for the diode, as drawn, together with the electronic symbol with positive and negative ends and current flow I.

Figure 3:
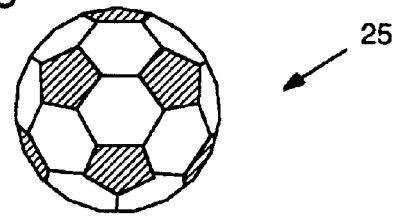
FIG. 3 is a high level representation of carbon $C_{60}$.

The preferred embodiment of the novel organic semiconductor device 10 is based on a structure known colloquially as a "buckyball" structure, a "Buckminsterfullerene", or "fullerene", which structures were named after R. Buckminster Fuller, who designed geodesic domes. Fullerenes include $C_{60}$ molecules (also known as carbon-60), $C_{60}$ compounds and other organic molecules. A $C_{60}$ compound is a blend of $C_{60}$ molecules and another material, which can be created, for example, by evaporating them together. $C_{60}$ has several advantages because it is a stable material with high carrier mobility ($\sim 2$ $cm^2/vs$) and is capable of forming high quality films. Further, when a thermal annealing process described below is used, $C_{60}$ offers the additional advantage of being capable of being thermally annealed in air. FIG. 3 illustrates the molecular structure 25 of $C_{60}$. $C_{60}$ with a purity of 98% may be purchased from Aldrich Chemical.

As a result, the preferred embodiment uses $C_{60}$ as the organic layer, although other embodiments may use other organic materials instead. For example, the organic layer may comprise any of the $C_{60}$, $C_{70}$ and $C_{80}$ family of materials, other fullerenes and any derivatives and variants of the above. Moreover, the organic layer may comprise a polymer version of a fullerene. For example, a polymer version may be created by attaching $C_{60}$ to various sites on a polymer backbone. Polymers offer the advantage of being more easily processable and printable.

Still optionally, the organic layer may comprise a nanotube such as a carbon nanotube. The nanotube, of course, vary in terms of their lengths, diameters, electronic properties and materials. For example, nanotubes can be as small as 100 atoms in diameter and may self-assemble into angstrom-sized circuit elements. See, e.g., "Nanotubes Self-assemble into Circuit Elements," *EE Times*, Mar. 28, 2002; "IBM says nanotube transistor beats silicon," *EE Times*, May 20, 2002.

Other alternatives to the organic material are organic holes and electron transporting materials, as shown in the following Table 1:

TABLE 1

| Abbreviated name | Chemical name | formula |
|---|---|---|
| TCNQ | 7,7,8,8-tetracyanoquinodimethane | |
| TCNE | tetracyanoethylene | |
| | chloranil | |
| TNAP | 11,11,12,12-tetracyano-2,6-naphthquinodimethane | |
| $C_{60}$ | fullerene | |
| Hole Transport molecules | | |
| TPD | | |

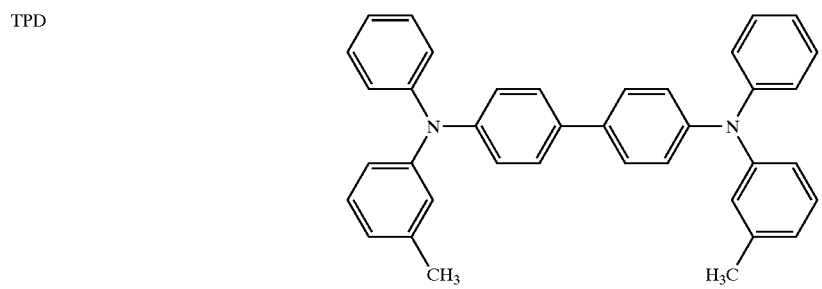

TABLE 1-continued
| Abbreviated name | Chemical name | formula |
|---|---|---|
| mTADATA | | 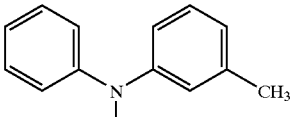 |
| α-NPD | | 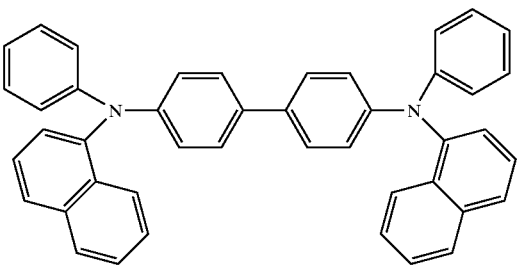 |
| HTM-1 | | 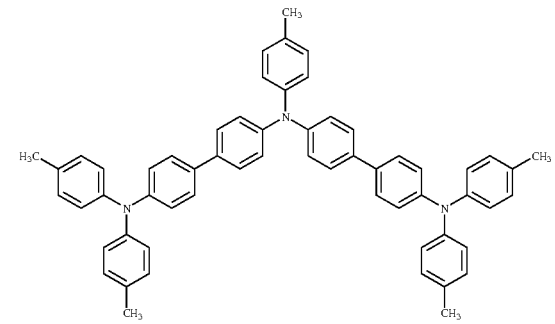 |
| TPTE | | 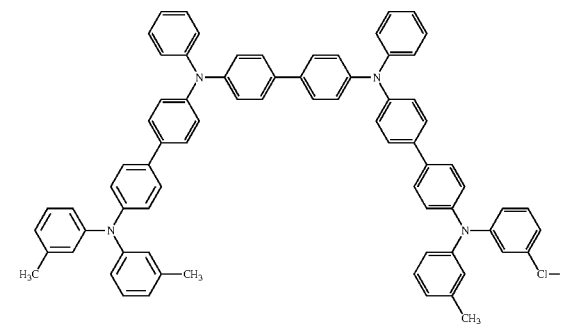 |

TABLE 1-continued

| Abbreviated name | Chemical name | formula |
| --- | --- | --- |
| Electron transport molecules | | |
| t-Bu-PBD | | |
| BND | | |
| OXD-7 | | |
| OXD-Star | | |
| TAZ | | |

Still other alternatives to the organic material are organic compounds, as shown in the following Table 2.

TABLE 2
| Abbreviated name | Chemical name | formula |
|---|---|---|
| TTF | tetrathiafulvalene | 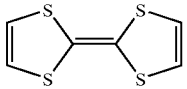 |
| Pc | Phthalocyanine | 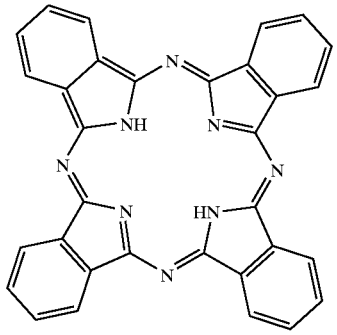 |
| CuPc | Copper(II) phthalocyanine | 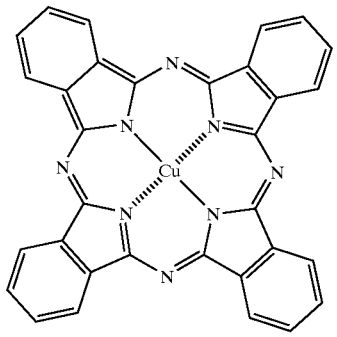 |
| NiPc | Nickel(II) phthalocyanine | 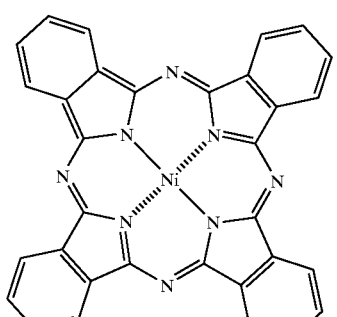 |
| CoPc | Cobalt(II) phthalocyanine | 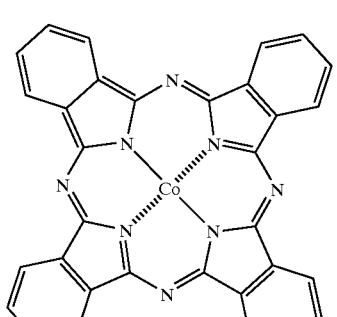 |

TABLE 2-continued

| Abbreviated name | Chemical name | formula |
|---|---|---|
| TMTSF | Tetramethyltetraselenafulvalene | |
| BEDT-TTF | Bis(ethylenedithioltetrathiafulvalene) | |
| BMDT-TTF | Bis(methylenedithio)tetrathiafulvalene | |

More alternatives to the organic material are compounds for organic light emitting diodes (OLEDs), which typically include small molecular materials such as those in Table 3.

TABLE 3

| Abbreviated name | Chemical name | formula |
|---|---|---|
| Alq3 | | |
| Bebq | | |
| BAlq1 | | |

TABLE 3-continued

| Abbreviated name | Chemical name formula |
| --- | --- |
| ZnPBO | |
| ZnPBT | |
| DTVBi | |
| DCM | |
| QA | |

TABLE 3-continued

| Abbreviated name | Chemical name formula |
|---|---|
| Rubrene | |
| Perylene | |
| DPVBi | |

Still other alternatives to the organic materials are compounds for polymer light emitting diodes (PLEDs), such as those listed in Table 4.

TABLE 4

| Abbreviated name | Chemical name | formula |
|---|---|---|
| PA | Trans polyacetylene | |
| PDA | polydiacetylene | |
| PPP | Poly(p-phenylene) | |
| PPV | Poly(p phenylenevinylene) | |

TABLE 4-continued

| Abbreviated name | Chemical name | formula |
|---|---|---|
| RO-PPV | Poly(2,5-dialkoxy-p-phenylenevinylene) | |
| MEH-PPV | | |
| PPPv | | |
| DHeO-CN-PPv | | |
| MEH-CN-PPv | | |

TABLE 4-continued
| Abbreviated name | Chemical name | formula |
|---|---|---|
|  | Poly(3-alkyl-thiophene) | 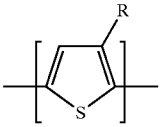 |
|  | Ladder poly(phenylene) | 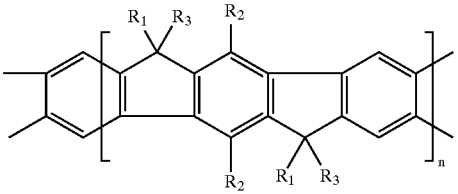 |
|  | Ladder PPP copolymer | 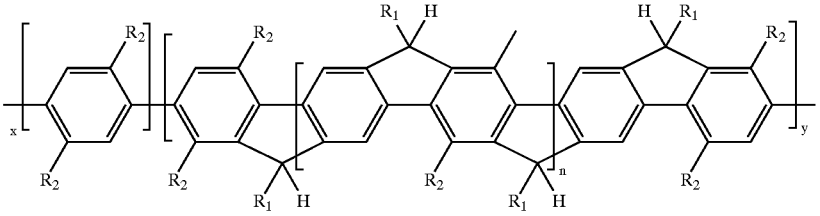 |
| PT | Polythiophene | 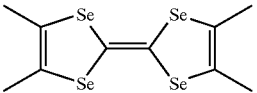 |
| P3AT | Poly(3-alkyithiophene) | 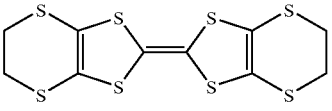 |
| PTV | Poly(2,5-thiophenevinylene) | 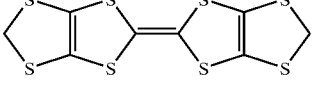 |
| PPy | Polypyrrole | 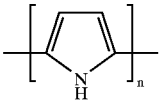 |
| PAni | Polyaniline | 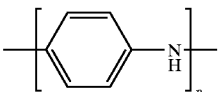 |
| PEDOT |  | 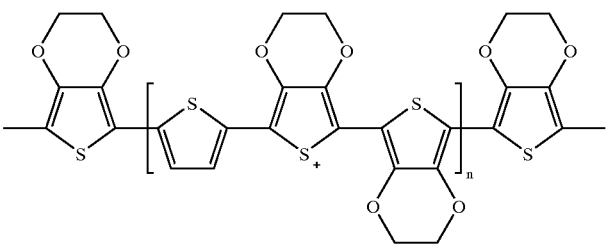 |

TABLE 4-continued

| Abbreviated name | Chemical name | formula |
|---|---|---|
| Dopants for PEDOT | | (structure shown: two polymer repeat units with phenyl-SO$_3^-$ and phenyl-SO$_3$H pendant groups, subscripts n and m) |

Thus, the organic layer 20 may comprise various kinds of organic materials. The organic materials may be selected based on, for example, their melting points, how well they form films, their electro-negativity and their charge mobilities. Differential scanning colarimetery (DSC) can be used to measure the melting point of organic materials.

An example embodiment of the novel process for creating a high performance organic semiconductor device is described next. This example embodiment of the process is described with respect to creating a high performance organic diode; however, the process can be readily adapted to form other kinds of organic devices. Because this particular example is of a diode, the device has two electrodes, the anode and cathode. If the high performance semiconductor device is some other device, the references to "electrode" may refer to an electrical contact to the device. Therefore, all references to "electrode" refer to a conductive electrical connection to or from the device. The organic semiconductor device 10 being formed may be supported on a substrate, if desired. First because a substrate is preferable, the first electrode material 22, such as copper (Cu), is preferably deposited by thermal evaporation on the substrate. The substrate may be rigid, flexible, or semi-rigid, as well as transparent, semi-transparent, or opaque. For example, the substrate may be precleaned glass, silicon (Si) layer, silicon oxide (SiO) layer, quartz, or some other substrate. Alternatively, the first electrode material may be deposited, grown, printed, stamped, or otherwise formed on the glass, silicon, or silicon oxide layer. Still alternatively, the first electrode material may be deposited, grown, printed, stampable, or otherwise formed on a flexible substrate, such as polyethylene terephthalate (PET), so that the resulting structure may be flexible. Conductor, semiconductor and insulator materials can be printed onto the substrate, including by ink jet printing processes. See, e.g., the references incorporated by reference and listed in the Background of the Invention section. Of course, the materials may be deposited, grown, printed, stamped, or otherwise formed in a variety of patterns. For instance, materials may be formed in an inter-digitated pattern, which has potential applications for biosensors and other uses. Then after depositing or otherwise forming the first electrode 22 onto a substrate, the organic layer(s) 20 can be deposited or formed on the first electrode 22. The second electrode 24 is then deposited or otherwise formed on the organic layer 20.

If the organic device is a light-emiting device, such as a light-emitting diode (LED), the substrate is preferably transparent or at least translucent so that the light can be transmitted outside the device. Such transparent-like substrates include PET and polyimide (PI). On the other hand, if the organic device is not a light-emiting device, the substrate may be any polymer or metal that is functional.

The substrate may be, for example, a polymer film, polymer substrate, metal foil, or metal layer.

The substrate may have a variety of desired properties. For instance, the substrate may be conductive, nonconductive, electromagnetic, ferromagnetic, or ferroelectric. Conductive substrate materials include aluminum (Al), copper (Cu), gold (Au), silver (Ag), iron (Fe), tin (Sn), zinc (Zn), nickel (Ni), cobalt (Co), chromium (Cr), magnesium (Mg), titanium (Ti), indium (In), tungsten (W), platinum (Pt), potassium (K), arsenic (As), calcium (Ca), lithium (Li), properly doped silicon (Si), stainless steel, other conductive materials, and metal alloys including, for example, alloys of the above elements. Of course, the substrate material must be selected based on its properties. Magnesium, potassium and lithium-aluminum (Li—Al) are reactive and therefore suited only for particular applications. Stainless steel is conductive, but not very conductive, and may be suited for certain applications. Nonconductive substrate materials include polymers, organic materials, Solgels, polyethylene (PE), polystyrene (PS), PTFE (teflon®), PET, Kapton®, glass, silicon, and silicon with a PS coating. Solgels are a known class of materials, which may be doped with air bubbles, ceramic materials, and other particles. Polymers may be preferred as the substrate because they are available as thin films. Electromagnetic, ferromagnetic and ferroelectric substrate materials are subsets of conductive materials. Depending on the property of the selected substrate, the substrate may be used to form a ground plane, antenna and other functional structures.

Continuing the description of an example embodiment of the novel process, the copper layer, which has been deposited or otherwise formed on the substrate, forms a first electrode 22. The organic material, such as $C_{60}$, is deposited, grown, printed, stamped, or otherwise formed on the first electrode 22 to create the organic layer 20. Then the second electrode material, such as aluminum (Al), is deposited or otherwise formed on the organic layer 20 to create the second electrode 24. Alternatively, any method known to those of skill in the art may be used to form the components of the organic semiconductor device 10.

Instead of using copper and aluminum as the electrodes 22, 24, other conductive materials, and even conductive non-metals, may be used to form the first and second electrodes 22, 24. For instance, any one or combination of the conductive materials listed for conductive substrates above may be used as any of the electrodes. Various combinations of these and other conductive materials may be used to form the electrodes. The material to form the electrodes may be selected based on, for example, the material's metal work function, diffusion coefficient and charge transfer capability with organic compounds.

An organic diode was created with $C_{60}$ as an organic layer sandwiched between an aluminum electrode and a copper electrode (hereinafter, referred to as "Cu/C$_{60}$/Al"). The as-deposited Cu/C$_{60}$/Al diode exhibited poor performance with low injection current and low rectification ratio.

Due to the environmental sensitivity of organic materials, many processes being used in the silicon technology cannot be directly applied to organic devices. For example, traditional knowledge dictates that organic materials should not be subject to heat since organic materials are vulnerable to heat. However, in a preferred embodiment of the novel process, the organic semiconductor device (e.g., a Cu/C$_{60}$/Al diode) is fabricated or provided, a thermal annealing process is applied to the fabricated device, and the heated device may be cooled if desired. The cooling step may be to actively cool the heated device down by subjecting the heated device to, for example, cold air. Alternatively, the cooling step may be passive by simply letting the heated device cool down on its own. This novel process transforms the organic semiconductor device into one having enhanced performance characteristics. The enhanced performance characteristics may include, for example, the ability of the device to operate at higher speeds and higher current densities.

The application of heat, or thermal annealing, to the organic semiconductor device 10 is believed to create a low resistance contact between the organic material and the metal material of the organic semiconductor device 10 for more efficient charge injection. The creation of this metal-organic material contact may include an ohmic contact and/or a Schottky barrier junction in the forward direction. Additionally, thermal annealing may cause the ions or atoms from the first and second electrodes 22, 24 (here, metal atoms) to migrate or diffuse into the organic, layer 20, cause the organic layer 20 to crystallize, or both. The migration or diffusion of the electrode ions/atoms from the first and second electrodes 22, 24 into the organic layer 20 during annealing may dope the organic layer 20 at the interface between the organic layer 20 and the electrode 22 or 24. Some charge-transfer likely occurs at the metal electrode-to-organic layer interface. In addition, the thermal annealing process may cause a morphological change in the organic layer 20. For example, the organic material may crystallize in the presence of thermal annealing, which enhances the carrier mobility significantly. The properties of the organic material such as film formability and morphology can be evaluated with an optical microscope, scanning electron microscope (SEM), atomic force microscope (AFM), and/or X-ray diffraction, which would reveal the surface morphology and crystallization of the organic material.

Figure 4:
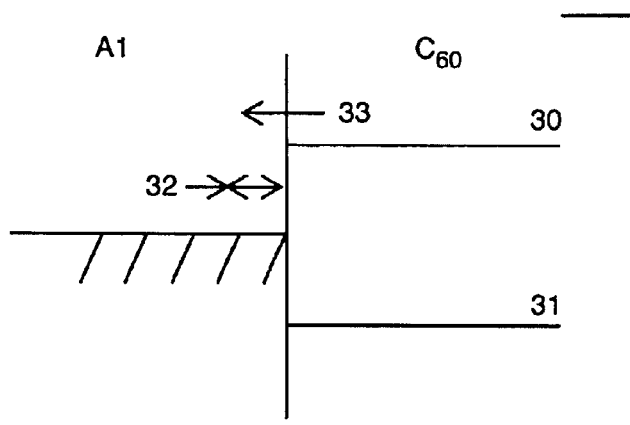
FIG. 4 is a highly schematic representation of the junction between an aluminum electrode and $C_{60}$ organic layer when an example of the novel process is applied to the junction.

FIG. 4 illustrates a highly schematic diagram of the aluminum-to-C$_{60}$ contact of a Cu/C$_{60}$/Al organic semiconductor that has been thermal annealed. The diagram includes a conduction band 30 and a valence band 31. Charge 32 should not flow easily from the metal (e.g., aluminum) to the organic layer (e.g., C$_{60}$), while charge 33 should flow easily from the organic layer (e.g., C$_{60}$) to the metal material (e.g., aluminum).

Figure 5:
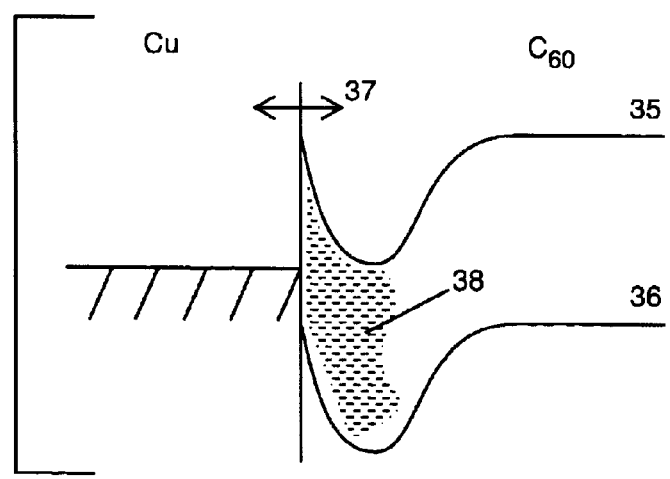
FIG. 5 is a highly schematic representation of the junction between a copper electrode and $C_{60}$ organic layer when an example of the novel process is applied to the junction.

FIG. 5 illustrates a highly schematic diagram of the copper-to-C$_{60}$ contact of the Cu/C$_{60}$/Al organic semiconductor that has been thermally annealed. The diagram includes a conduction band 35 and a valence band 36. When the contact between the copper metal and the organic material is subject to high temperature thermal annealing, copper atoms diffuse from the metal (e.g., copper) to the organic layer 20 (e.g., C$_{60}$), which dopes the organic layer interface and forms an ohmic contact between the copper metal and the organic layer. It seems that charge 37 flows easily in either direction, that is, from the metal (e.g., copper) to the organic layer (e.g., C$_{60}$) and from the organic layer (e.g., C$_{60}$) to the metal (e.g., copper). The dip in the bands indicates that the organic layer 20 is doped.

Alternatively, the organic semiconductor device 10 may be subjected to any process that creates or establishes a low resistance contact between the organic material and the metal material of the organic semiconductor device 10 for more efficient charge injection. The alternative process may also create an ohmic contact and/or a Schottky junction in the forward direction. Additionally, the alternative process may cause migration of the electrode ions/atoms from the first and second electrodes 22, 24 into the organic layer 20, that causes the organic layer 20 to crystallize, or both. For example, the alternative processes may include any one of, or combination of, an electrical current passing from one electrode to the other electrode, a voltage bias between the first and second electrodes 22, 24, a voltage bias between one of the electrodes and the organic layer 20, laser energy that provides localized heating, infrared energy and ultraviolet energy. The current and/or voltage bias can be of any desired polarity or direction. Moreover, the current may be alternating current (ac), direct current (dc), or some combination. For example, as discussed below with respect to FIGS. 11 and 12, eight AC volts has been applied to an experimental organic diode, which resulted in enhanced operating characteristics. Still other possibilities include directing any other form of energy, such as radiation energy and acoustic energy, to the organic semiconductor or portion of the organic semiconductor. The migration or diffusion of the electrode ions/atoms from the first and second electrodes 22, 24 into the organic layer 20 during annealing (or the application of other forms of energy) is believed to dope the organic layer 20 at the interface between the organic layer 20 and the electrode 22 or 24.

Figure 6:
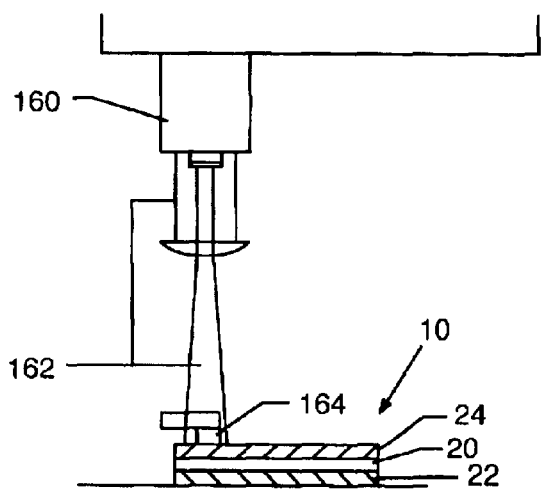
FIG. 6 is a block diagram of a laser adapted to heat a localized area of an organic semiconductor device.

FIG. 6 is a block diagram of a laser adapted to heat a localized area 164 of an organic semiconductor device. A laser 160 emits an electromagnetic radiation beam 162 at the localized portion of an organic semiconductor device 10. The beam 162 may be aimed, focused, or otherwise adjusted by a variety of known elements, such as mirrors, lenses, gratings, and beamsplitters.

As an alternative to applying the energy to the device after the device has been fabricated, any of the energies described herein may be applied in-situ during the fabrication or deposition process. For example, the deposition process or processes may be performed while the organic layer 20 is subject to heat.

Rather than determining the nature of the junction between the electrode 22 (or 24) and the organic layer 20 only by the energy band structure of each of the materials, possible chemical reactions between the electrode material and the organic layer material may also be relevant. The diffusion depth profile may be ascertainable by using the Auger spectroscope with an Argon ion sputtering system. In addition, Ultraviolet Photoelectron Spectroscopy (UPS) and X-ray Photoelectron Spectroscopy (XPS) can be used to characterize the properties of the interface between the organic layer 20 and the electrodes 22, 24.

Experimental organic diodes were fabricated out of an organic layer of C$_{60}$ film with a thickness less than 100 nm, a first electrode 22 formed out of copper and a second electrode 24 formed out of aluminum. The device area of this sandwich-type diode as defined by the overlap of the two electrodes 22, 24 was 0.25 mm$^2$. All the depositions were carried out in a vacuum of about $1\times10^{-6}$ torr. Of course, the device area, thickness of layers, orientation of layers, and device geometries may be varied as desired. For example, the thickness of the devices may range from 10 to 1000 nanometers (nm), the device area can be as small as 50×50 nm$^2$ and as large as in the cm$^2$ range or even larger. Of course, the inclusion of these ranges into this disclosure is not intended to limit the novel processes to the ranges, as other ranges may also work under similar principles taught by the novel processes. For diodes, devices with smaller areas operate at higher frequencies because they have smaller intrinsic parasitic capacitance across the diode for a given dielectric thickness, but can carry less current. As another example, the thickness of the materials may be 5 micron or even sub-micron (e.g., less than 1 micron). As yet another example, the thickness of $C_{60}$ as the organic layer 20 in a diode can range from several hundred to several thousand angstroms; the same is true for the anode and cathode materials. However, if the thickness of the organic layer 20 is thicker, it may be easier to fabricate the organic layer without pinholes or shorts. Furthermore, the wires or conductive areas for connection to the organic semiconductor device can be of any size, including a crosspoint size of less than 1 micron. Alternatively, the wires or conductive areas can be larger, such as in the millimeter range, if they must carry more current.

Figure 7:
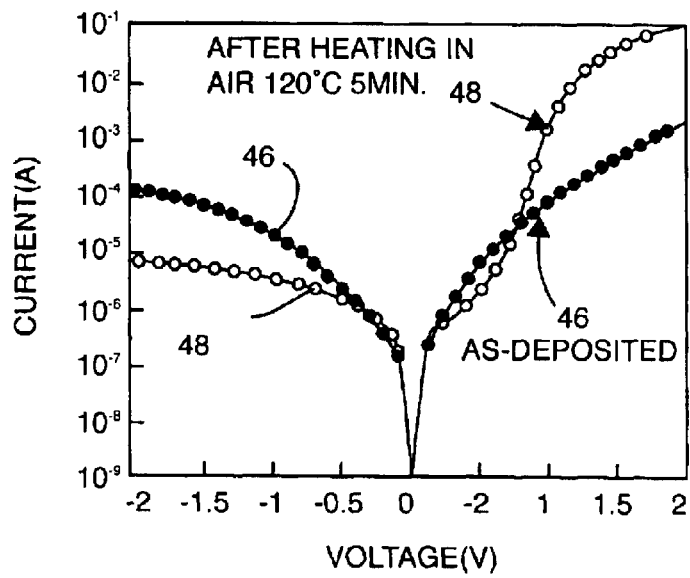
FIG. 7 is a graph illustrating the current-voltage characteristics of an untreated experimental organic diode and an annealed experimental organic diode.

An as-deposited, non-annealed organic diode shows low carrier injection with poor current rectification. After an organic diode device, $Cu/C_{60}/Al$, was treated at 120° C. for 5 minutes in air, the annealed organic diode became a high performance organic diode with a rectification ratio in the range of $10^4$–$10^6$. It seems that higher temperatures, for example to 200° C., result in even higher performance devices. Based on experimental data, FIG. 7 illustrates the current-to-voltage (I-V) curves for the annealed organic diode as compared to the non-annealed organic diode. As shown in FIG. 7, I-V curve 46 is based on laboratory data for the as-deposited (e.g., non-annealed) organic diode, while IV curve 48 is based on laboratory data for the annealed organic diode. Preferably, when the applied voltage is higher than zero (e.g., a positive voltage), the current is as high as possible; likewise, when the applied voltage is less than zero (e.g., a negative voltage), the current is as small as possible. Thus, the I-V curves 46, 48 demonstrate that the annealed organic diode outperforms the non-annealed organic diode in terms of the amount of current density that can be handled by the diode. The thermal annealing process and I-V measurements were all done in air, which indicate that the annealed organic diode is stable in air. Alternatively, the organic semiconductor may be annealed in a vacuum, a gas, a gas mixture, a fluid, a fluid mixture, or other environment to obtain performance characteristics as desired.

Figure 8:
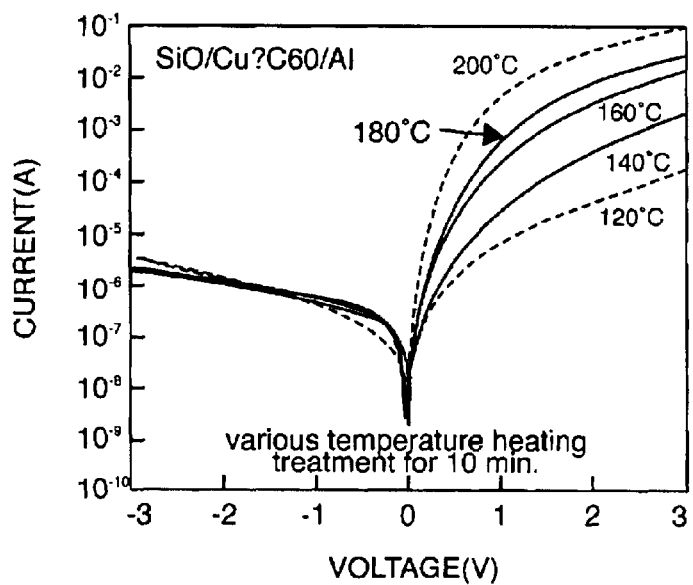
FIG. 8 is a graph illustrating the current-voltage characteristics of five annealed experimental organic diodes, each of which annealed at a different temperature.

Moveover, on annealing the fabricated device at temperatures between 120° C. and 200° C., the performance characteristics of the device progressively improved as the annealing temperature was increased. FIG. 8 shows the I-V curves for five $Cu/C_{60}/Al$ diodes on a silicon oxide substrate, which were subject to 120° C., 140° C., 160° C., 180° C. and 200° C. in air for ten minutes respectively. As FIG. 8 plainly shows, the performance characteristics of the organic diode improved as the annealing temperature increased. This suggests the gradual formation of a rectified junction at one of the two interfaces during thermal annealing, as well as an ohmic contact at the other interface. A "junction" is a joining of two different semiconductors or of a semiconductor and a metal at an interface. For example, junctions include, but are not limited to, heterojunctions, Schottky barrier junctions and p-n junctions. The resulting organic device is very stable in air and can be operated in air for at least two weeks without any degradation in performance. In addition, the organic device can operate at current densities of 400 A/cm$^2$ at six volts, which exceeds the performance of any other reported organic device.

To further improve the performance of the organic diode, the purity of the organic material in the organic layer 20 may be increased. The leakage or dark current when the applied voltage is less than zero can be reduced if the organic material in the organic layer 20 is purer. The purified organic material can be thermally coated onto substrates at different evaporation rates and then thermally annealed at elevated temperatures. In addition, the substrate temperature may be controlled or adjusted during evaporation in order to further change device performance.

Figure 9:
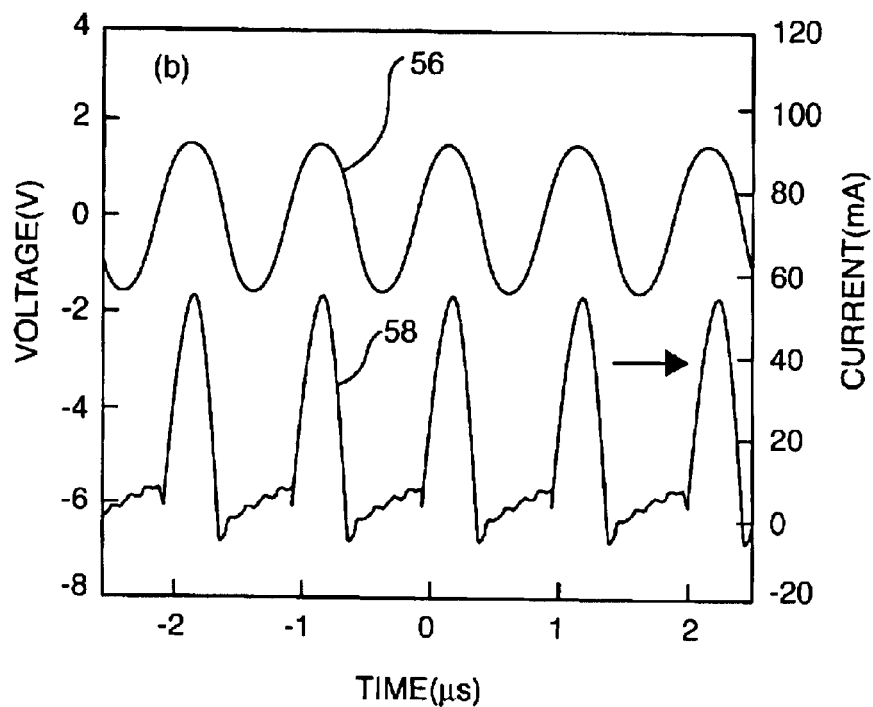
FIG. 9 is a graph illustrating the input voltage vs. output current characteristics of an annealed experimental organic diode with a 1 megahertz AC voltage signal.

FIG. 9 illustrates the high-frequency performance response of an experimental annealed organic diode, $Cu/C_{60}/Al$, which was treated at 120° C. for 5 minutes in air. When an AC voltage signal 56 of 1 MHz frequency was applied to the annealed organic diode, the signal 58 is the frequency response of the annealed organic diode. Although the annealed organic diode operated at a frequency of 1 MHz in this example, the diode should be readily capable of operation at much, much greater frequencies.

The annealed organic diode can easily reach current densities of 100A/cm$^2$ with a switching speed exceeding 1 MHz, which is about 100 times faster than traditional $Alq_3$ type organic LEDs with a similar device area. In experiments, current densities as high as 400A/cm$^2$ have been reached for annealed organic diodes. With sufficiently high current densities, the diodes can drive various electronic components such as OLED displays.

The range of temperatures applied to the organic semiconductor devices may be from about 60° C. to about 300° C. The duration of time that the heat is applied to the organic device may range from about several seconds to several hours. As with all of the ranges included into this disclosure, the inclusion of the ranges is not intended to limit the novel processes to the ranges, as other ranges may also work under similar principles taught by the novel processes.

Figure 10:
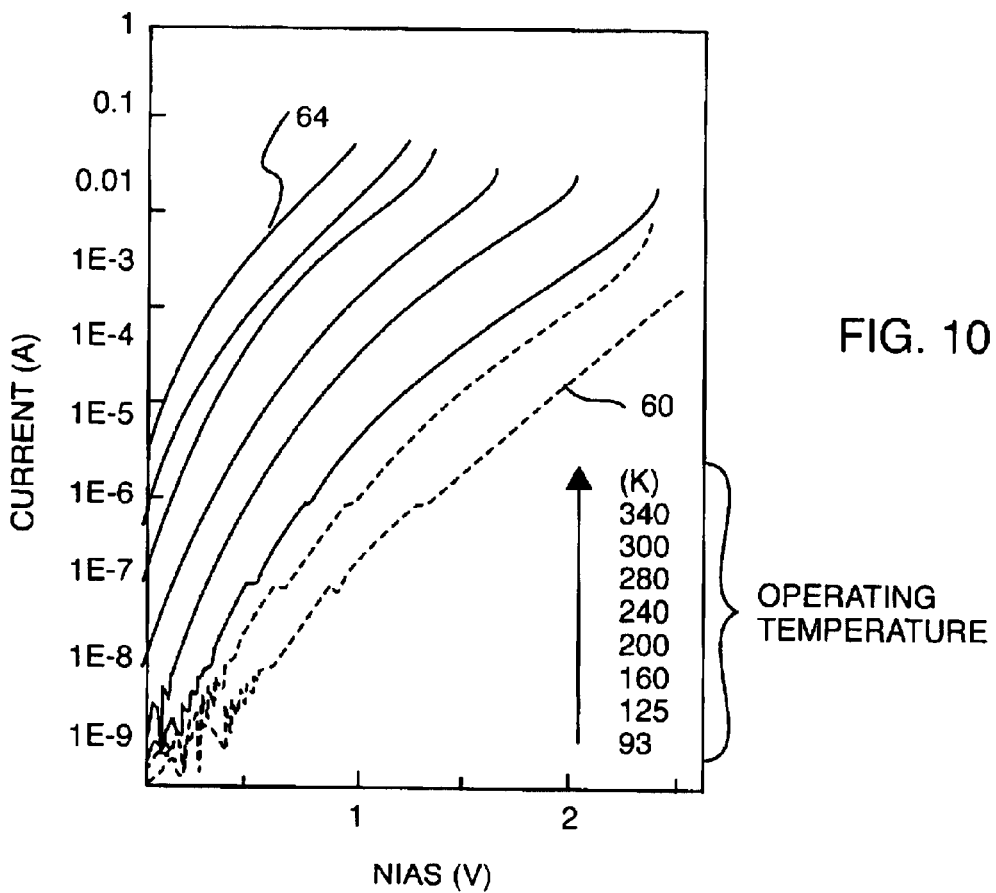
FIG. 10 is a graph illustrating the current-voltage characteristics of an annealed experimental organic diode operated at different temperatures.

Alternatively, if high intensity energy in the form of thermal, electrical, optical and/or radiation energy is applied to the organic device, the duration of exposure can be significantly reduced. For example, similar results were found when experimental organic diodes, $Al/C_{60}/Cu$, were subject to AC voltage instead of an annealing process. The amplitude of the AC voltage applied to the organic device depends on the device's thickness and may range, for example, from about several volts to several tens of volts. The frequency of the AC voltage may also range, for instance, from hertz to megahertz, or higher. Experiments indicate that several seconds to several minutes of applying the AC voltage to the organic device are enough to create a high performance organic diode. FIG. 10 is a graph of the I-V curves that demonstrate how an example annealed $Al/C_{60}/Cu$ diode operates at different temperatures from 93 to 340° K. The I-V curves suggest that the current flows from the ohmic contact toward the rectified junction.

Thus, it appears that when organic diodes are treated by the novel process, one of the electrode contacts becomes ohmic and the other contact becomes rectified. A rectified junction may be, for example, a Schottky barrier junction or a narrow p-n junction. A Schottky junction may form at the $C_{60}/Al$ interface and an ohmic contact may form at the copper/$C_{60}$ interface due to a charge transfer process. As shown in FIG. 10, the behavior at low temperature supports the existence of both mechanisms of a Schottky junction and an ohmic contact. Although U.S. Pat. No. 6,037,718, entitled "Display Unit Having Transistor of Organic Semiconductor Stacked on Organic Electroluminescence Element," assigned to Sanyo Electric Co., Ltd., which is hereby incorporated by reference for purposes, purports to have created p-n, n-p, n-p-n, and p-n-p junctions, the '728 patent uses a different process.

In order to create a high performance organic transistor, high quality ohmic contacts and/or junctions between the electrodes and the organic layer 20 are generally required for efficient charge injection. Because the novel processes described herein form an ohmic contact in a controllable fashion, the process may be used to improve the performance of other organic devices, such as organic transistors and other organic semiconductor devices. For example, the novel process may be used to create better source and drain ohmic contacts to the organic layer of an organic transistor. Further, the improvement in carrier mobility caused by the novel process may be applied to other organic semiconductor devices, such as organic transistors. The mobility of crystalline $C_{60}$, for instance, can be at least as high as 2 $cm^2/vs$, making it suitable for use in organic transistors.

Figure 11:
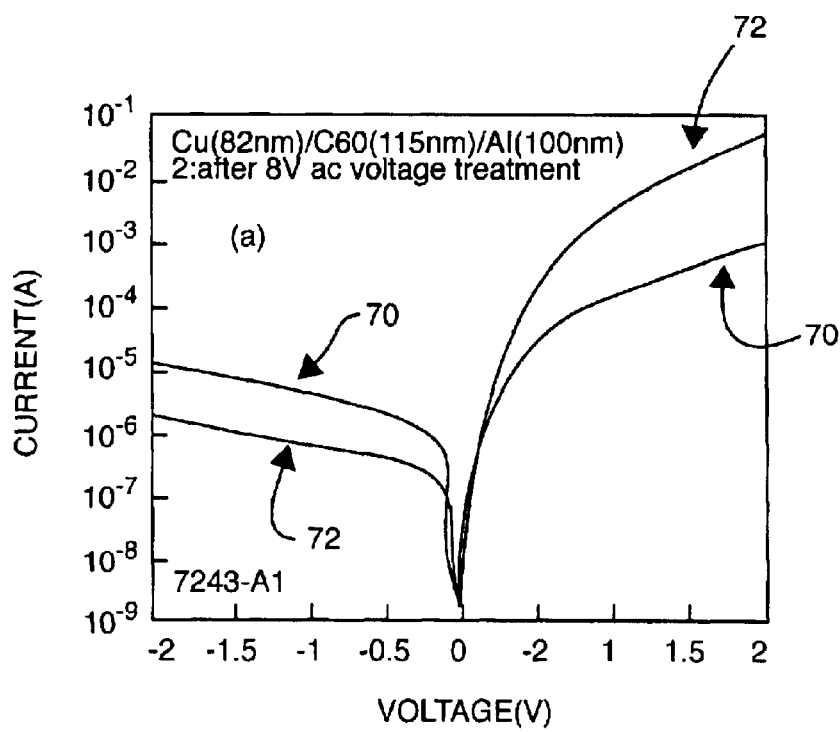
FIG. 11 is a graph illustrating the current-voltage characteristics of an annealed experimental organic diode that has been treated by 8 AC volts.

FIG. 11 is a graph illustrating the results of applying an alternating current (AC) voltage to an experimental organic semiconductor. The vertical axis illustrates the current in amps, while the horizontal axis illustrates the applied DC voltage in volts, for the sandwiched organic diode of Al electrode (100 nm)—$C_{60}$ (115 nm)—Cu electrode (82 nm). Curve 70 depicts the current-voltage characteristics for the organic diode before it has been subjected to an electrical voltage treatment process. Curve 72 depicts the current-voltage characteristics for the organic diode after 8 volts of AC voltage was passed through the diode. As is apparent, the electrical voltage treatment improves the operating characteristics of the organic diode.

Figure 12:
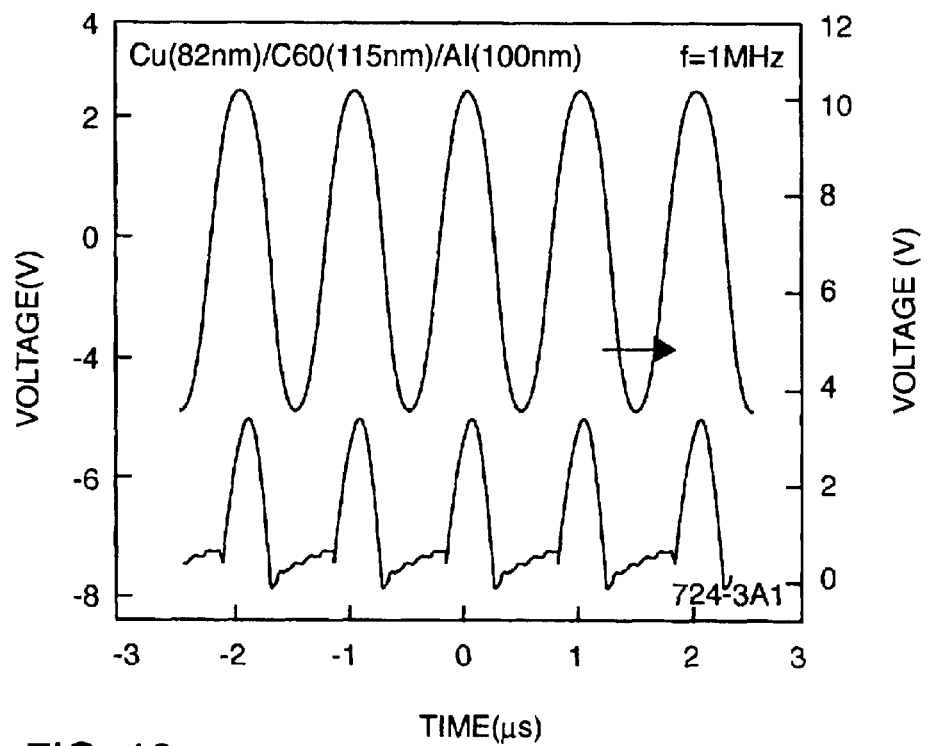
FIG. 12 is a graph illustrating the high-frequency performance response characteristics of an annealed experimental organic diode to a 1 megahertz AC voltage signal.

FIG. 12 depicts a graph of the response 80 to an input voltage source signal of the organic diode of FIG. 11 that has been treated with AC voltage. As can be readily seen, the improved organic diode is able to operate at 1 MHz frequency, which is a significant improvement over the speeds of prior art organic diodes.

Other advantages may result from using this novel process. Generally, prior art diodes are created by using electrodes formed of metals having dissimilar work functions, especially when the diode has two Schottky junctions, back to back. For a traditional single layer organic diode, the rectifying behavior results from the difference in work functions of the two metal electrodes. Metal electrodes with different work functions create barrier heights favoring efficient charge carrier injection in one bias direction, but not the other. Hence, for organic light-emitting diodes (OLEDs), metals of low work function, such as calcium or magnesium or lithium, may be used to form the cathode, while metals of high work function, such as gold or indium tin oxide (ITO), may be used to form the anode.

By contrast, the organic semiconductors described in this disclosure can be formed into diodes using metal electrodes having similar work functions. This is noteworthy because the prior art requires dissimilar work functions to produce diode rectification behavior. As an example, the organic diode may be formed of copper/$C_{60}$/aluminum (Cu/$C_{60}$/Al), where the cathode electrode 24 is fabricated of copper and the anode electrode 22 is fabricated of aluminum. The work functions of aluminum and copper are about 4.2 and 4.7 eV, respectively. Although materials of similar work functions may be used, it is preferable to use different materials for the first and second electrodes 22, 24 in order to create different junctions on the opposite sides of the organic layer 20, if one wants to create a diode. Of course, organic diodes subject to the novel method may use metal electrodes 22, 24 having dissimilar work functions, if desired. As an example of dissimilar work functions, the electrodes 22, 24 may be formed out of gold (5.2 eV) and calcium (2.9 eV).

Figure 13:
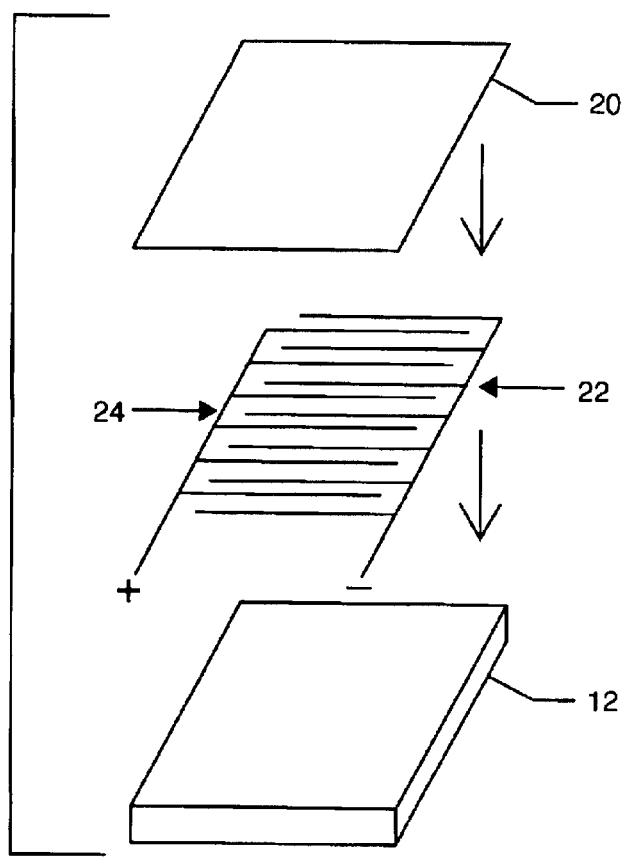
FIG. 13 is an exploded piece-part view of an organic semiconductor device on a substrate in a surface cell configuration.
Figure 14:
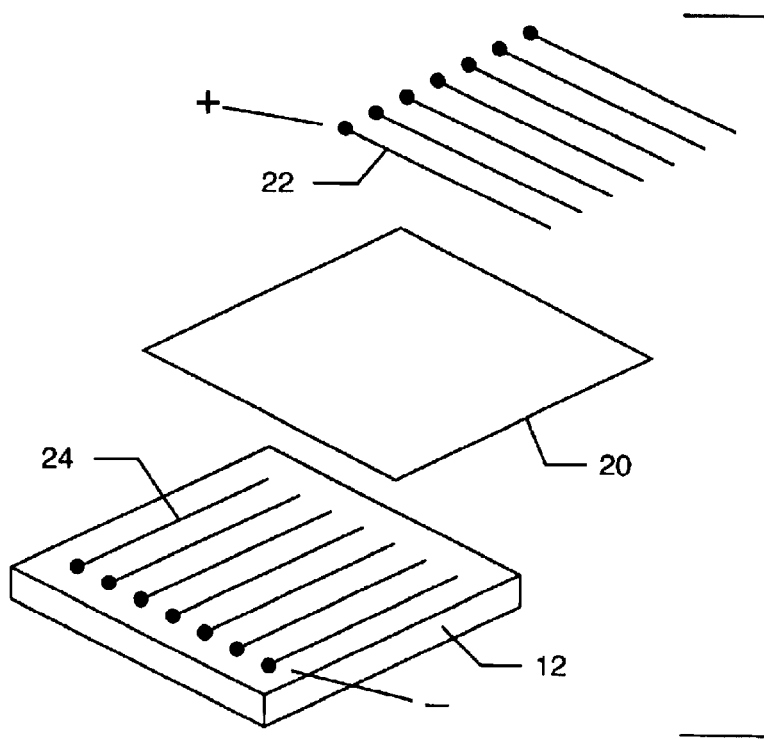
FIG. 14 is an exploded piece-part view of an organic semiconductor device on a substrate in a crossbar configuration.

The novel processes described in this disclosure are not limited to creating diodes. Instead, the novel processes may be used to create other organic devices, such as organic transistors and even other more complex electronic components such as integrated circuits and complete products. Electronic components that can be created include any component that implements a semiconductor p-n, n-p, Schottky junction, any combination of these, or any combination of these with an insulator, dielectric and/or conductor. The geometric structures of the components may be vertical structures, horizontal structures, layered vertical structures, layered horizontal structures, any combination of vertical and horizontal structures, or any other three-dimensional structure. For example, FIG. 13 is an exploded piece-part view of an organic semiconductor device 10 on a substrate 12, where the electrodes 22, 24 are oriented perpendicular to the organic layer 20 in a surface cell or horizontal pattern. Still alternatively, FIG. 14 is an exploded piece-part view of an organic semiconductor device 10 on a substrate 12, where the row and column electrodes 22, 24 are in a crossbar or vertical configuration.

The novel processes possibly may be applied to organic based semiconductor devices including, but not limited to, diodes, tunnel diodes, Schottky diodes, varicap diodes, varacters, junction transistors (p-n-p and/or n-p-n), insulated gate FET's, uni-junction transistors, programmable uni-junction transistors, thyristors, rectifying charge storage elements as described in U.S. patent application Ser. No. 09/723,897, titled "Rectifying Charge Storage Element," filed on Nov. 28, 2000, now U.S. Pat. No. 6,414,543, issued July 2, 2002, organic light emitting diodes, polymer light emitting diodes, photodiodes, resistors, capacitors, inductors, insulators, and complementary transistor pairs. Other new device types not yet conceived or described may possibly be constructed using the novel processes in this disclosure. Based on these novel devices and their interconnections on the substrate on which they are formed, various functional integrated circuits may be fabricated. The number of types of functional circuits possible increases geometrically as the number of different kinds of components that can be made using the new process.

Figure 15:
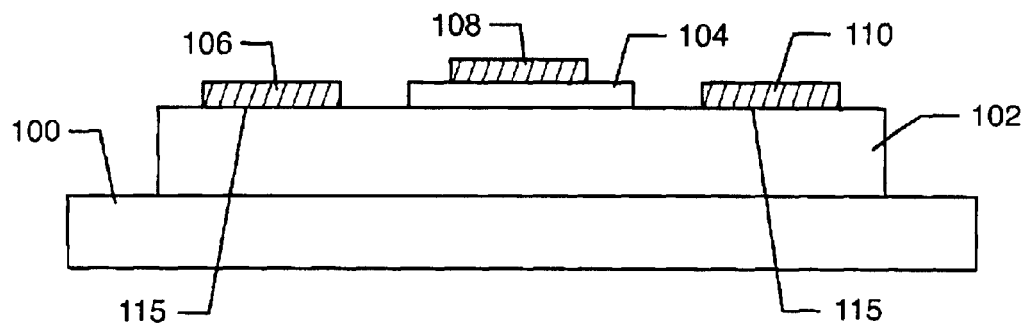
FIG. 15 illustrates a first example embodiment of an organic semiconductor insulated gate field effect transistor.

FIG. 15 illustrates an example embodiment of a top contact insulated gate field effect transistor (IGFET) that can be made using the novel methods described here. A substrate 100 formed of silicon, glass, plastic, or other material has an organic or polymeric semiconductor 102 formed on the substrate 100. The organic semiconductor 102 is preferably $C_{60}$. An insulator 104 is formed on the organic semiconductor 102. Preferably the source and drain contacts 106 and 110 are made of the same material, preferably copper, but may be another conductive material. The gate contact 108 may be made of any conductive material, preferably gold. After applying the novel process to the IGFET, good ohmic contacts 115 are formed.

One example method of fabricating the IGFET of FIG. 15 is as follows. An organic semiconductor 102 is deposited or otherwise formed on a substrate 100. An insulator 104 is deposited or otherwise formed on the organic semiconductor 102. Portions of the insulator 104 is etched away. Metal is preferably deposited or otherwise formed on the organic semiconductor 102 to create the source 106 and drain 110, while metal is preferably deposited or otherwise formed on the insulator 104 to create the gate 108. Preferably, the device is annealed at a high temperature greater than 60° C. and lower than 300° C. to create the ohmic contacts 115.

Figure 16:
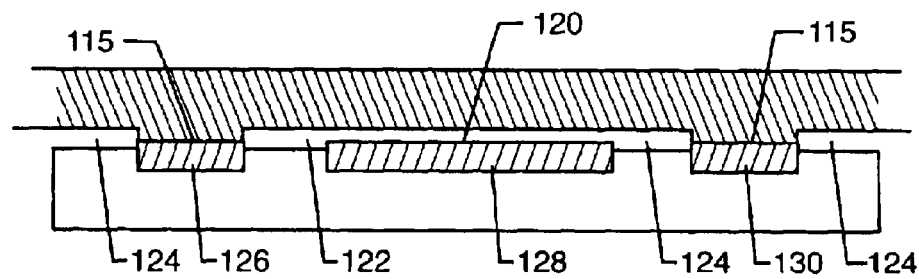
FIG. 16 illustrates a second example embodiment of an organic semiconductor insulated gate field effect transistor.

FIG. 16 illustrates an example embodiment of a "bottom contact" IGFET that can be made using the novel methods described here. On a silicon wafer 122 is an organic or polymeric semiconductor 120. The organic semiconductor 120 is preferably $C_{60}$. An insulator 124 is formed between the organic semiconductor 120 and the silicon wafer 122, as shown in FIG. 16. Preferably the source and drain contacts 126 and 130 are made of the same material, preferably copper, but may be another conductive material. The gate contact 128 may be made of any conductive material, preferably gold. After applying the novel process to the IGFET, good ohmic contacts 115 are formed.

One example method of fabricating the IGFET of FIG. 16 is as follows. Metal is preferably deposited or otherwise formed on the substrate 122 to create the source 126, gate 128 and drain 130. An insulator 124 is deposited or otherwise formed on the substrate 122, source 126, gate 128 and drain 130. Portions of the insulator 124 may be etched away to reveal the source 126, gate 128 and drain 130. An organic semiconductor 120 is deposited or otherwise formed on the insulator 124 and substrate 122. Preferably, the device is annealed at a high temperature greater than 60° C. and lower than 300° C. to create the ohmic contacts 115.

Figure 17:
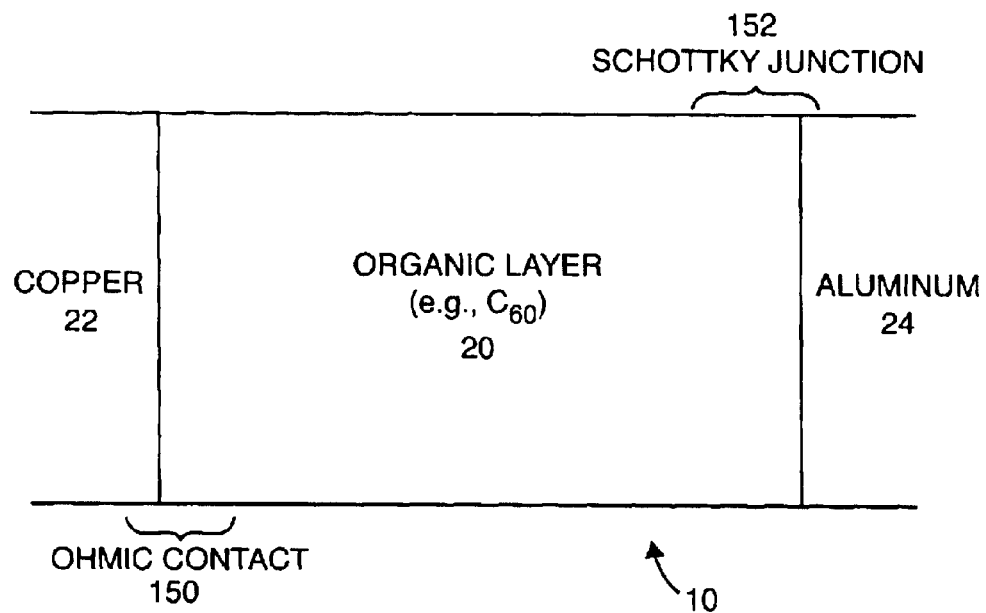
FIG. 17 is a representation of the contacts and junctions formed by the novel process on an organic $Cu/C_{60}/Al$ diode device.

FIG. 17 is a highly schematic representation of the contacts and junctions formed by the novel process on an organic Cu/$C_{60}$/Al diode device. The organic diode of FIG. 17 has an organic layer 20 comprising $C_{60}$, a first electrode 22 comprising copper, and a second electrode 24 comprising aluminum. Application of the novel process is believed to create an ohmic contact 150 between the copper electrode 22 and the organic layer 20, a Schottky barrier junction 152 between the aluminum electrode 24 and the organic layer 20.

Examples of elementary circuits and devices that may possibly use the improved organic devices include rectifiers, logic gates, power supplies, clock circuits, counters, memories, tuned antenna coils, modulators, radio frequency identification (RFID) tags, optical ID tags, displays, flexible displays, smart flexible displays, photovoltaic cells, audio transducers, radio frequency (RF) transponders, smartcards, computers, televisions, data recorders, and other circuits and devices.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. Further, the metals and organic materials described in the example embodiments may be changed to other metals and/or organic materials. As another example, each feature of one embodiment can be mixed and matched with other features shown in other embodiments. Features and processes known to those of ordinary skill in the art of material science, organic materials, electrical engineering, and semiconductor processing may similarly be incorporated as desired. Additionally and obviously, features may be, added or subtracted as desired. Accordingly, the invention is not to be restricted except in light of the attached claims and their equivalents.

What is claimed is:

1. A method of forming a low resistance contact between a metal material and an organic material of a fabricated organic semiconductor device, the method comprising:

subjecting the fabricated organic semiconductor device to a temperature higher than 60° C. and sufficient to cause the metal material to diffuse into the organic material to form a low resistance contact between the metal and the organic material of the organic semiconductor device, substantially without melting the organic material; and cooling the organic semiconductor device.

2. The method of claim 1 wherein the organic semiconductor device is heated in the presence of air.

3. The method of claim 1 wherein the organic semiconductor device is heated in the presence of a vacuum.

4. The method of claim 1 wherein the organic semiconductor device is heated in the presence of a gas.

5. The method of claim 4 wherein the gas in nitrogen.

6. The method of claim 4 wherein the gas is oxygen.

7. The method of claim 4 wherein the gas is a gas mixture.

8. The method of claim 1 wherein the cooling step is permitting the heated organic semiconductor device to cool down.

9. The method of claim 1 wherein the cooling step includes applying a temperature lower than the heating temperature to the organic semiconductor device.

10. The method of claim 1 wherein the metal material comprises copper.

11. The method of claim 1 wherein the metal material of the organic semiconductor device includes a first metal material and a second metal material and further wherein the temperature is sufficient to cause the first and second metal materials to diffuse into the organic layer.

12. The method of claim 11 wherein the second metal material comprises aluminum.

13. The method of claim 11 wherein the second metal material includes at least one of aluminum, copper, gold, silver, iron, tin, zinc, nickel, cobalt, chromium, magnesium, titanium, indium, tungsten, platinum, potassium, arsenic, calcium and lithium.

14. The method of claim 1 wherein the subjecting step increases the crystallization of the organic material.

15. The method of claim 1 wherein the organic material comprises a fullerene.

16. The method of claim 15 wherein the organic material comprises a member of the $C_{60}$ family.

17. The method of claim 15 wherein the organic material comprises a member of the $C_{70}$ family.

18. The method of claim 15 wherein the organic material comprises a member of the $C_{80}$ family.

19. The method of claim 1 wherein the organic material comprises a compound.

20. The method of claim 19 wherein the compound includes a member of the $C_{60}$ family.

21. The method of claim 19 wherein the compound includes a member of the $C_{70}$ family.

22. The method of claim 19 wherein the compound includes a member of the $C_{80}$ family.

23. The method of claim 1 further comprising fabricating the organic semiconductor device with the metal material and the organic material prior to said subjecting step.

24. The method of claim 23 wherein the organic material is flexible.

25. The method of claim 23 further comprising forming the metal material to be flexible.

26. The method of claim 23 further comprising forming a second metal of the organic semiconductor device to be flexible.

27. The method of claim 23 further comprising printing the organic material of the organic semiconductor on a substrate.

28. The method of claim 23 further comprising depositing the organic material of the organic semiconductor on a substrate.

29. The method of claim 23 further comprising forming the organic semiconductor device on a substrate.

30. The method of claim 29 wherein the substrate is flexible.

31. The method of claim 30 wherein the substrate comprises polyethylene terephthalate.

32. The method of claim 29 wherein the substrate is rigid.

33. The method of claim 32 wherein the substrate comprises glass, silicon or silicon oxide.

34. The method of claim 29 wherein the substrate is transparent.

35. The method of claim 29 wherein the substrate comprises a metal.

36. The method of claim 24 wherein the metal material is flexible.

37. The method of claim 35 wherein the metal includes at least one of aluminum, copper, gold, silver, iron, tin, zinc, nickel, cobalt, chromium, magnesium, titanium, indium, tungsten, platinum, potassium, arsenic, calcium and lithium.

38. The method of claim 35 wherein the metal comprises stainless steel.

39. The method of claim 35 wherein the metal comprises an alloy.

40. The method of claim 34 wherein the substrate comprises doped silicon.

41. The method of claim 29 wherein the substrate is non-conductive.

42. The method of claim 41 wherein the substrate comprises a second organic material.

43. The method of claim 41 wherein the substrate comprises a Solgel.

44. The method of claim 41 wherein the substrate comprises at least one of polyethylene, polystyrene, PTFE or teflon, polyethylene terephthalate, Kapton and silicon with a polystyrene coating.

45. The method of claim 29 wherein the substrate includes an electromagnetic material.

46. The method of claim 29 wherein the substrate includes a ferromagnetic material.

47. The method of claim 29 wherein the substrate includes a ferroelectric material.

48. The method of claim 29 wherein the substrate comprises an organic film.

49. The method of claim 48 wherein the substrate comprises a polymer film.

50. The method of claim 1 wherein the organic semiconductor device has a first electrode and a second electrode, the first and second electrodes being formed out of materials having similar work functions.

51. The method of claim 1 wherein the organic semiconductor device has a first electrode and a second electrode, the first and second electrodes being formed out of materials having substantially dissimilar work functions.

52. The method of claim 1 further comprising forming a Schottky junction between the metal material and the organic material.

53. The method of claim 52 wherein the metal material is aluminum.

54. The method of claim 52 wherein the organic material is a fullerene.

55. The method of claim 1 further comprising forming an ohmic contact between the metal material and the organic material.

56. The method of claim 55 wherein the metal material is copper.

57. The method of claim 55 wherein the organic material is a fullerene.

58. The method of claim 1 wherein the low resistance contact includes an ohmic contact between the organic material and the metal material.

59. The method of claim 1 wherein the low resistance contact includes a Schottky junction between the organic material and the metal material.

* * * * *